United States Patent
Yang et al.

(10) Patent No.: US 9,406,559 B2
(45) Date of Patent: Aug. 2, 2016

(54) SEMICONDUCTOR STRUCTURE AND METHOD FOR FORMING THE SAME

(71) Applicant: Taiwan Semiconductor Manufacturing Co., Ltd, Hsin-Chu (TW)

(72) Inventors: Han-Wei Yang, Hsinchu (TW); Chen-Chung Lai, Guanxi Township (TW); Song-Bor Lee, Zhubei (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 0 days.

(21) Appl. No.: 14/323,496

(22) Filed: Jul. 3, 2014

(65) Prior Publication Data

US 2016/0005650 A1    Jan. 7, 2016

(51) Int. Cl.

| | |
|---|---|
| *H01L 21/768* | (2006.01) |
| *H01L 29/78* | (2006.01) |
| *H01L 23/535* | (2006.01) |
| *H01L 29/66* | (2006.01) |
| *H01L 23/485* | (2006.01) |
| *H01L 29/49* | (2006.01) |
| *H01L 29/51* | (2006.01) |
| *H01L 23/532* | (2006.01) |

(52) U.S. Cl.
CPC ........ *H01L 21/76895* (2013.01); *H01L 23/485* (2013.01); *H01L 23/535* (2013.01); *H01L 29/66575* (2013.01); *H01L 23/53295* (2013.01); *H01L 29/4966* (2013.01); *H01L 29/517* (2013.01)

(58) Field of Classification Search
CPC ............... H01L 21/28247; H01L 21/823828; H01L 21/823871; H01L 29/4966; H01L 29/517; H01L 29/66545; H01L 29/6656; H01L 29/6659; H01L 29/7833; H01L 29/78; H01L 21/76895; H01L 29/66568; H01L 29/66575; H01L 23/485; H01L 23/535; H01L 23/53295
USPC ........................................................ 257/619
See application file for complete search history.

(56) References Cited

U.S. PATENT DOCUMENTS

| | | | | |
|---|---|---|---|---|
| 4,966,870 | A  * | 10/1990 | Barber et al. | .................. 438/637 |
| 6,228,731 | B1 * | 5/2001 | Liaw | .................. H01L 21/76831 257/E21.507 |
| 2009/0321795 | A1* | 12/2009 | King et al. | ..................... 257/288 |
| 2010/0038687 | A1* | 2/2010 | Klaus | ................ H01L 21/31105 257/288 |
| 2010/0270627 | A1* | 10/2010 | Chang | ............... H01L 21/28247 257/411 |
| 2012/0228679 | A1 | 9/2012 | Chang et al. | |
| 2013/0034946 | A1 | 2/2013 | Chuang et al. | |
| 2013/0320459 | A1 | 12/2013 | Shue et al. | |

* cited by examiner

*Primary Examiner* — Marc Armand
*Assistant Examiner* — Quovaunda V Jefferson
(74) *Attorney, Agent, or Firm* — Birch, Stewart, Kolasch & Birch, LLP

(57) ABSTRACT

A semiconductor structure and a method for forming the same are provided. The method includes forming a gate structure over a substrate and forming source and drain regions adjacent to the gate structure. The method also includes forming a first ILD layer surrounding the gate structure over the source and drain regions and forming a contact modulation structure over the gate structure. The method also includes etching the first ILD layer and the contact modulation structure to form a first contact trench over the source and drain regions and a second contact trench over the gate structure. The method further includes forming a first contact in the first contact trench and a second contact in the second contact trench. In addition, the first ILD layer has a first etching rate and the contact modulation structure has a second etching rate that is less than the first etching rate.

20 Claims, 4 Drawing Sheets

SEMICONDUCTOR STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

One of the important drivers for increased performance in computers is the higher level of integration of circuits. This is accomplished by miniaturizing or shrinking device sizes on a given chip. Tolerances play an important role in being able to shrink dimensions on a chip. Although the existing processes for forming a semiconductor structure have been generally adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
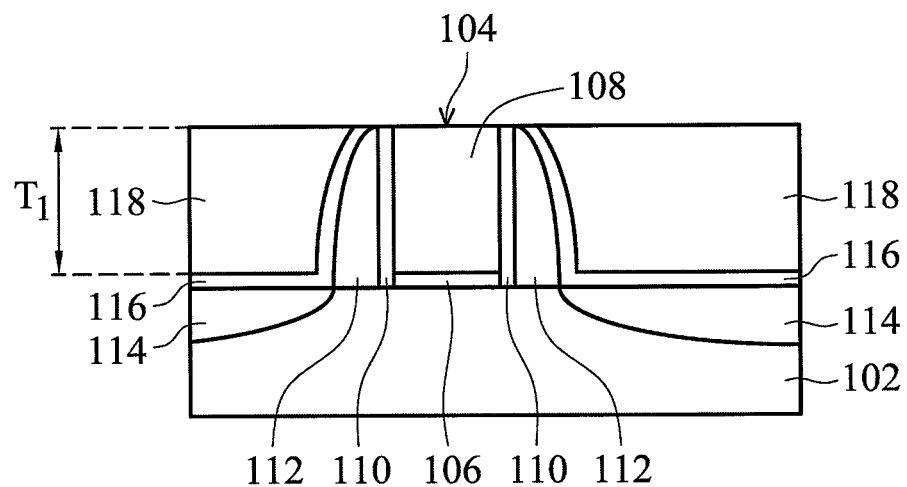
FIGS. 1A to 1G are cross-sectional representations of various stages of forming a semiconductor structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of a semiconductor structure are provided in accordance with some embodiments of the disclosure. The semiconductor structure may include a gate structure and a contact formed over the gate structure. In addition, a contact modulation structure may be used to prevent the formation of by-products over the gate structure during the process for forming the contact.

FIGS. 1A to 1G are cross-sectional representations of various stages of forming a semiconductor structure 100 in accordance with some embodiments. As shown in FIG. 1A, a substrate 102 is provided in accordance with some embodiments. Substrate 102 may be a semiconductor wafer such as a silicon wafer. Alternatively or additionally, substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

In addition, substrate 102 may include structures such as isolation features, doped regions, inter-layer dielectric (ILD) layers, and/or conductive features. Furthermore, substrate 102 may further include single or multiple material layers to be patterned. For example, the material layers may include a silicon layer, a dielectric layer, and/or a doped poly-silicon layer.

A gate structure 104 is formed over substrate 102, as shown in FIG. 1A in accordance with some embodiments. In some embodiments, gate structure 104 includes a gate dielectric layer 106 and a gate electrode layer 108. In some embodiments, gate dielectric layer 106 is made of high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), silicon nitride, silicon oxynitride, zirconium oxide, titanium oxide, aluminum oxide, hafnium dioxide-alumina ($HfO_2$—$Al_2O_3$) alloy, or other applicable dielectric materials.

In some embodiments, gate electrode layer 108 is made of polysilicon or metal. For example, gate electrode layer 108 may be made of a conductive material, such as aluminum, copper, tungsten, titanium, tantulum, titanium nitride, tantalum nitride, nickel silicide, cobalt silicide, TaC, TaSiN, TaCN, TiAl, TiAlN, or other applicable conductive materials. Gate dielectric layer 106 and gate electrode layer 108 may be formed by any applicable processes to any applicable thicknesses. In some embodiments, gate electrode layer 108 is formed by a "gate-last" process.

It should be noted that additional layers may be formed above and/or below gate dielectric layer 106 and gate electrode layer 108, such as work function metal layers, liner layers, interface layers, seed layers, adhesion layers, barrier layers, or the like. For example, a work function layer may be formed between gate dielectric layer 106 and gate electrode layer 108. The work function metal layer may be tuned to have a proper work function. For example, if a P-type work function metal (P-metal) for a PMOS device is desired, P-type work function materials may be used. Examples of the P-type work function materials include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other applicable materials.

On the other hand, if an N-type work function metal (N-metal) for NMOS devices is desired, N-type metal materials may be used. Examples of the N-type work function materials include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC), aluminides, and/or other applicable materials.

A sealing layer 110 is formed on the sidewalls of gate structure 104. Sealing layer 110 may protect gate structure 104 from damage or loss during subsequent processing and may also prevent oxidation during subsequent processing. In some embodiments, sealing layer 110 is made of silicon nitride, silicon oxide, silicon oxynitride, silicon carbide, or other applicable dielectric materials. Sealing layer 110 may include a single layer or multiple layers.

Spacers 112 are further formed on sealing layer 110 in accordance with some embodiments. In some embodiments, spacers 112 are made of silicon nitride, silicon oxide, silicon carbide, silicon oxynitride, or other applicable materials. Spacers 112 may be formed by deposition and etching processes.

In addition, various doped regions may also be formed in substrate 102 adjacent to gate structure 104 in accordance with some embodiments. In some embodiments, source and drain (S/D) regions 114 are formed in substrate 102, as shown in FIG. 1A in accordance with some embodiments. Source and drain regions 114 may be formed by ion implantation processes, photolithography, diffusion, and/or other applicable processes. In some embodiments, source and drain regions 114 are formed by recessing substrate 102 and filling the recesses by semiconductor materials such as silicon germanium (SiGe). More specifically, source and drain regions 114 may be formed by an epitaxial (epi) process. The epi process may include a selective epitaxy growth (SEG) process, CVD deposition techniques (e.g., vapor-phase epitaxy (VPE) and/or ultra-high vacuum CVD (UHV-CVD), molecular beam epitaxy, or other applicable epi processes. The epi process may include using gaseous and/or liquid precursors, which may interact with the composition of substrate 102. The deposited semiconductor material may be different from that of substrate 102. In this case, source and drain regions 114 may be referred to as strained source and drain regions or raised source and drain regions.

A contact etch stop layer (CESL) 116 is formed on spacers 112 and substrate 102 in accordance with some embodiments. In some embodiments, contact etch stop layer 116 is made of silicon nitride, silicon oxynitride, and/or other applicable materials. Contact etch stop layer 16 may be formed by plasma enhanced CVD, low pressure CVD, ALD, or other applicable processes.

A first inter-layer dielectric (ILD) layer 118 is formed surrounding gate structure 104 over substrate 102 in accordance with some embodiments. First inter-layer dielectric layer 118 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. First inter-layer dielectric layer 118 may be formed by chemical vapor deposition (CVD), physical vapor deposition, (PVD), atomic layer deposition (ALD), spin-on coating, or other applicable processes. In some embodiments, first inter-layer dielectric layer 118 has a first thickness $T_1$ in a range from about 500 A to about 1000 A.

Figure 1B:
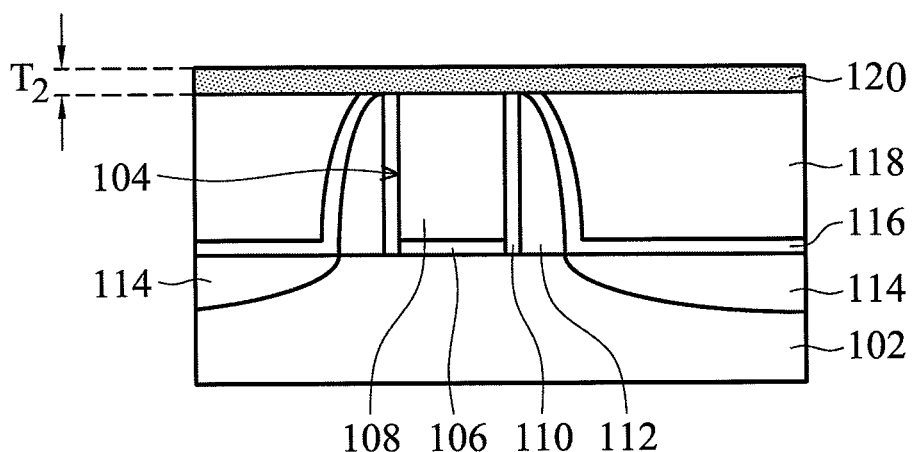

Next, a contact modulation layer 120 is formed over gate structure 104 and first inter-layer dielectric layer 118, as shown in FIG. 1B in accordance with some embodiments. In some embodiments, contact modulation layer 120 and first inter-layer dielectric layer 118 are made of different materials. In some embodiments, contact modulation layer 120 is made of silicon oxide, silicon nitride, silicon oxynitride, silicon carbide, tetraethoxysilane (TEOS), or other applicable dielectric materials. Contact modulation layer 120 may be formed by chemical vapor deposition (CVD), physical vapor deposition, (PVD), atomic layer deposition (ALD), spin-on coating, or other applicable processes. In some embodiments, contact modulation layer 120 has a second thickness $T_2$ in a range from about 10 A to about 200 A.

Figure 1C:
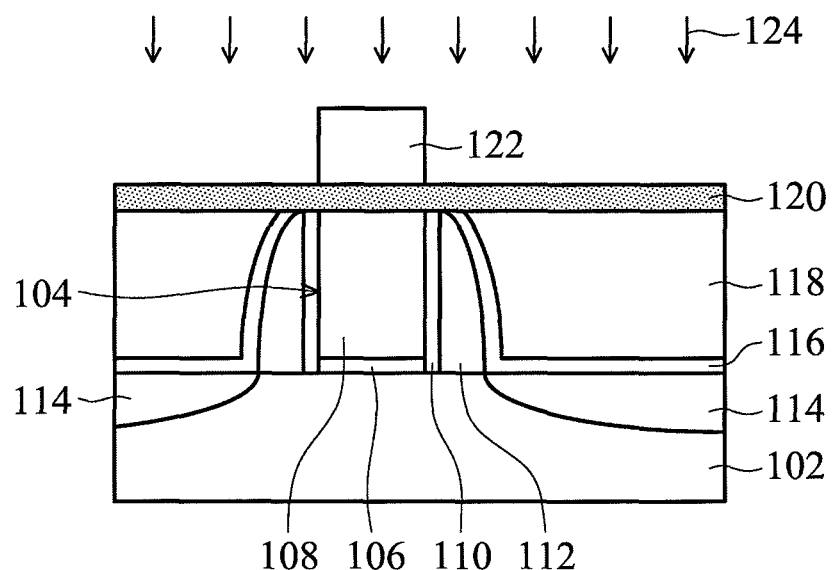

After contact modulation layer 120 is formed, a photoresist structure 122 is formed over contact modulation layer 120 and an etching process 124 is performed, as shown in FIG. 1C in accordance with some embodiments. The pattern of photoresist structure 122 may be transferred from the mask which is used to pattern gate structure 104, such that no extra mask is required to pattern photoresist structure 122. Therefore, photoresist structure 122 may have the same pattern as gate structure 104.

Figure 1D:
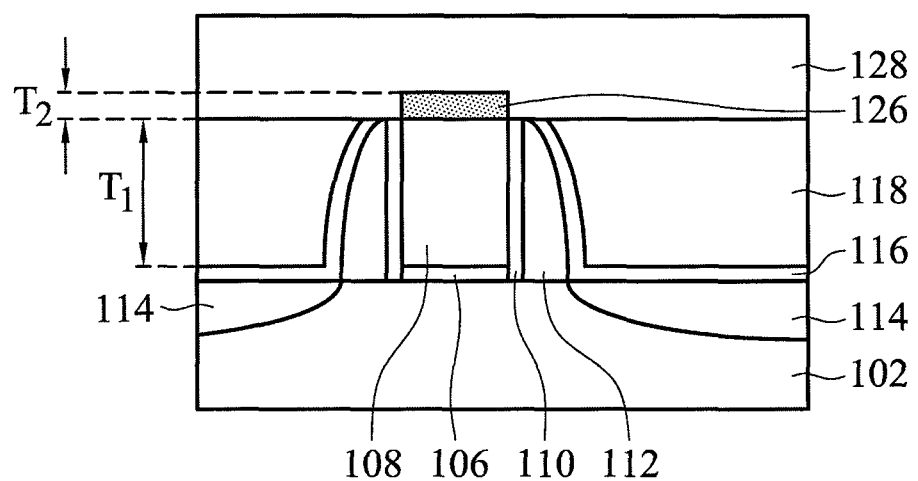

After etching process 124 is performed, contact modulation layer 120 is patterned to form a contact modulation structure 126, as shown in FIG. 1D in accordance with some embodiments. Contact modulation structure 126 is configured to prevent the formation of by-products formed over gate structure 104 in sequential etching processes. Therefore, the top surface of gate structure 104 is completely covered by contact modulation structure 126. As shown in FIG. 1D, contact modulation structure 126 has second thickness $T_2$ less than first thickness $T_1$ of first inter-layer dielectric layer 118. In some embodiments, a ratio of first thickness $T_1$ of first inter-layer dielectric layer 118 to second thickness $T_2$ of contact modulation structure 126 is in a range from about 100:1 to about 2.5:1.

As described previously, in some embodiments, photoresist layer 122 is patterned by the same mask as used for patterning gate structure 104, and therefore contact modulation structure 126 is substantially aligned with gate structure 104 and has the same width as gate structure 104 has. In some embodiments, contact modulation structure 126 overlaps with gate structure 104 but does not overlap with source and drain regions 114.

It should be noted that, although contact modulation structure 126 is shown only on gate structure 104, contact modulation structure 126 may further be formed extending from gate structure 104. For example, contact modulation structure 126 may further be formed over spacers 112. However, although contact modulation structure 126 may be formed over gate structure 104 and spacers 112, the portion of contact modulation layer 120 over source and drain regions 114, over which a contact is formed, should be removed. That is, contact modulation structure 126 should not extend to the portion of first inter-layer dielectric layer 118 over source and drain regions 114, where the contact is formed.

Next, a second inter-layer dielectric layer 128 is formed on contact modulation structure 126 and first inter-layer dielectric layer 118, as shown in FIG. 1D in accordance with some embodiments. In some embodiments, second inter-layer dielectric layer 128 is made of silicon oxide, silicon nitride, silicon oxynitride, or other applicable dielectric materials similar to, or the same as, first inter-layer dielectric layer 118. Second inter-layer dielectric layer 128 may be formed by chemical vapor deposition (CVD), physical vapor deposition, (PVD), atomic layer deposition (ALD), spin-on coating, or other applicable processes. In some embodiments, second inter-layer dielectric layer 128 has a thickness in a range from about 1500 Å to about 2500 Å. In some embodiments, second inter-layer dielectric layer 128 and contact modulation structure 126 are made of different materials.

Figure 1E:
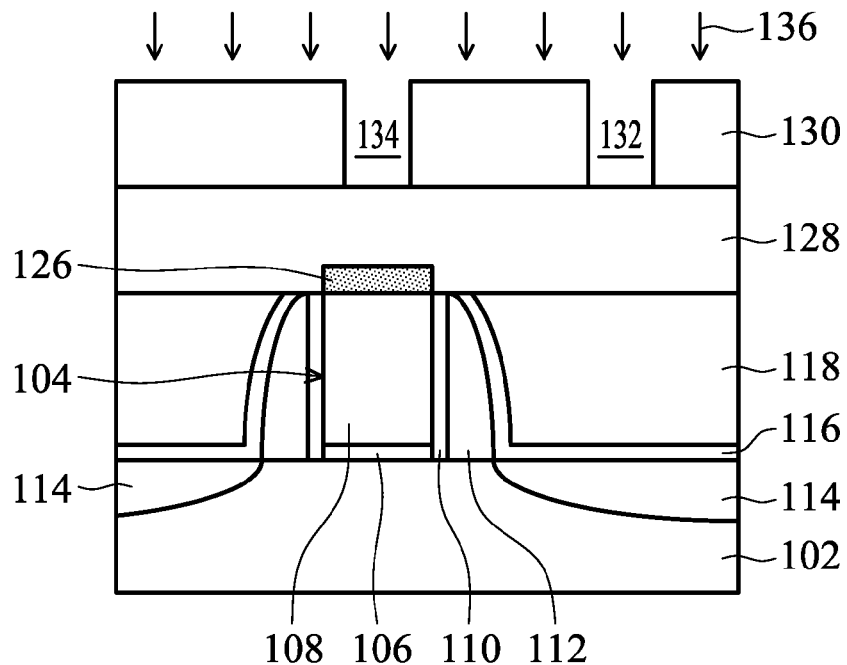
Figure 1F:
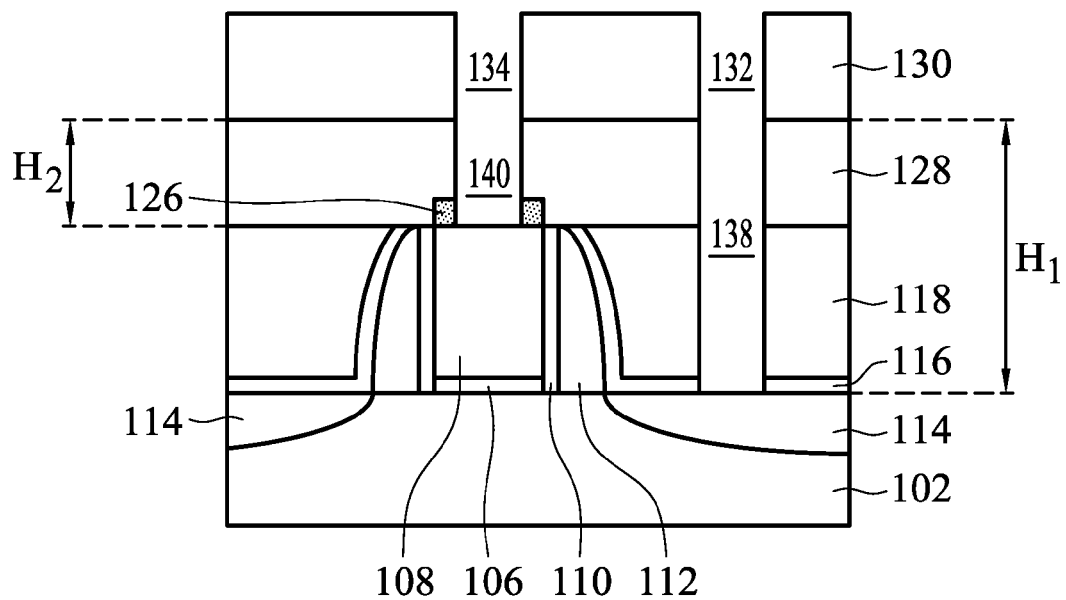

Afterwards, a photoresist layer 130 is formed over second inter-layer dielectric layer 128, as shown in FIG. 1E in accordance with some embodiments. Photoresist layer 130 has a first opening 132 over source and drain regions 114 and a second opening 134 over gate structure 104. After photoresist layer 130 is formed, a first contact trench 138 is formed over source and drain regions 114 and a second contact trench 140 is formed over gate structure 104 by an etching process 136, as shown in FIGS. 1E and 1F in accordance with some embodiments.

More specifically, portions of second inter-layer dielectric layer 128 and first inter-layer dielectric layer 118 are etched to form first contact trench 138, and portions of second inter-layer dielectric layer 128 and contact modulation structure 126 are etched to form second contact trench 140. As shown in FIG. 1F, first contact trench 138 has a first height $H_1$ and second contact trench 140 has a second height $H_2$ less than first height $H_1$. Therefore, if contact modulation structure 126 is not formed over gate structure 104, gate structure 104 will be over-etched during etching process 136 since first contact trench 138 and second contact trench 140 are formed at the same time by the same etching process.

Therefore, in some embodiments of the disclosure, contact modulation structure 126, which has a relatively low etching rate, is formed over gate structure 104 but not over the portion of source and drain regions 114 where first contact trench 138 is formed. As a result, the formation of second contact trench is relatively slow, compared to the formation of first contact trench 138. Accordingly, gate structure 104 will not be over-etched during etching process 136, and the formation of by-products is prevented.

In some embodiments, etching process 136 is a dry etching process. The dry etching process may include using an etching gas, and the etching gas includes helium (He), argon (Ar), hydrogen bromide (HBr), nitrogen ($N_2$), methane ($CH_4$), tetrafluoromethane ($CF_4$), monofluoromethane ($CH_3F$), difluoromethane ($CH_2F_2$), trifluoromethane ($CHF_3$), oxygen ($O_2$), or a combination thereof.

In some embodiments, the amount of time needed for etching first inter-layer dielectric layer 118 is substantially equal to the amount of time needed for etching contact modulation structure 126. In some embodiments, first inter-layer dielectric layer 118 has a first etching rate, and contact modulation structure 126 has a second etching rate that is less than the first etching rate. In some embodiments, the ratio of the first etching rate to the second etching rate is in a range from about 2.5:1 to about 100:1. Since the material used to form contact modulation structure 126 is selected to have a relatively low etching rate compared to that of first inter-layer dielectric layer 118, first contact trench 138 and second contact trench 140 can be formed by the same process, such as etching process 136, without forming by-products over gate structure 104.

Figure 1G:
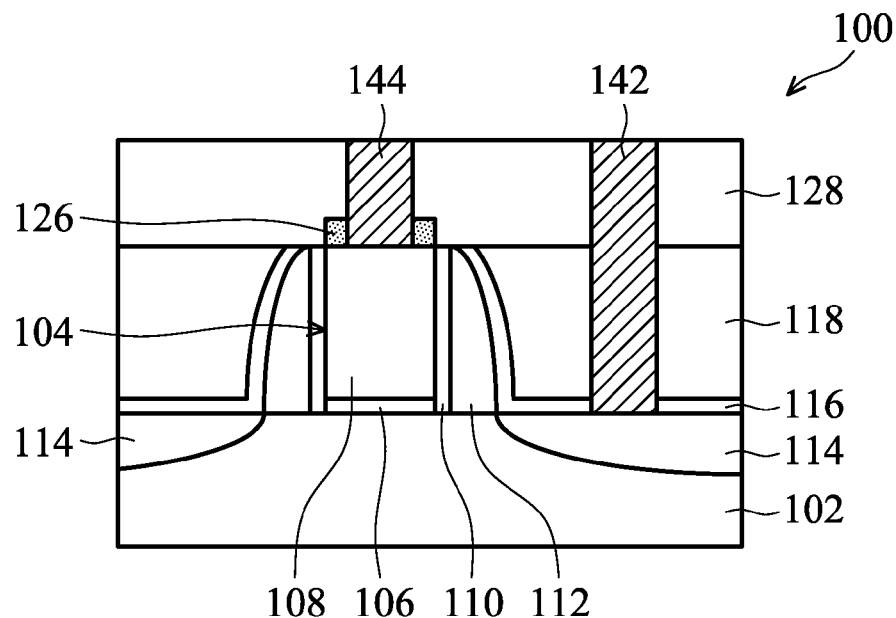

After first contact trench 138 and second contact trench 140 are formed, photoresist layer 130 is removed and first contact trench 138 and second contact trench 140 are filled with conductive materials to form a first contact 142 and a second contact 144 respectively, as shown in FIG. 1G in accordance with some embodiments. More specifically, first contact 142 is formed in first contact trench 138 over source and drain regions 114, and second contact 144 is formed in second contact trench 140 over gate structure 104. As shown in FIG. 1G, first contact 142 is formed through second inter-layer dielectric layer 128 and first inter-layer dielectric layer 118, and second contact 144 is formed through second inter-layer dielectric layer 128 and contact modulation structure 126. Accordingly, second contact 144 is in direct contact with contact modulation structure 126, while first contact 142 is not in direct contact with contact modulation structure 126.

In some embodiments, first contact 142 and second contact 144 are made of conductive materials such as aluminum (Al), copper (Cu), tungsten (W), titanium (Ti), tantalum (Ta), titanium nitride (TiN), tantalum nitride (TaN), nickel silicide (NiS), cobalt silicide (CoSi), tantulum carbide (TaC), tantulum silicide nitride (TaSiN), tantalum carbide nitride (TaCN), titanium aluminide (TiAl), titanium aluminide nitride (TiAlN), other applicable conductive materials, or a combination thereof.

Figure 2:
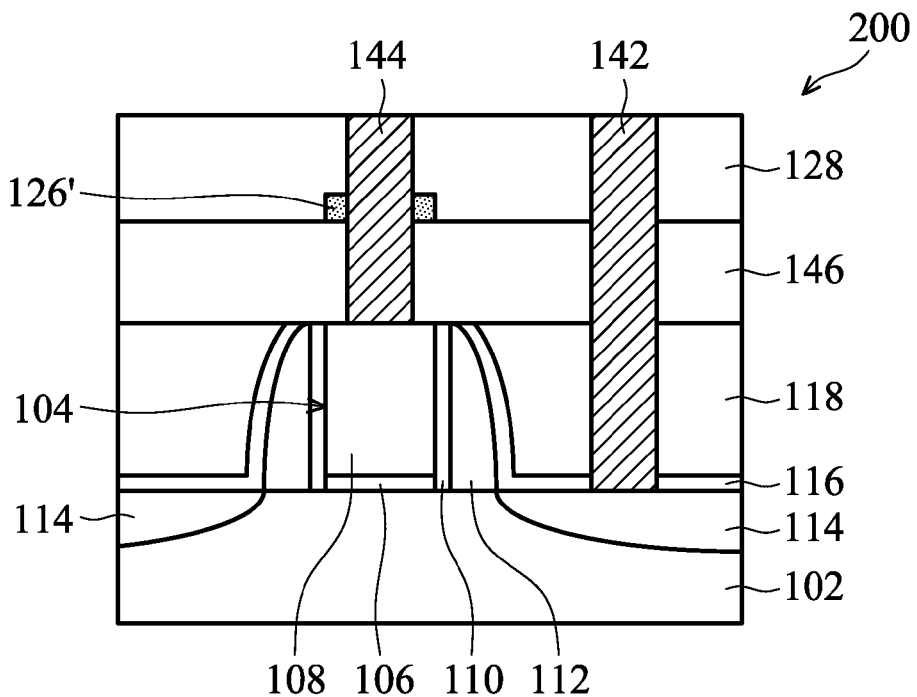
FIG. 2 is a cross-sectional representation of a semiconductor structure in accordance with some embodiments.

FIG. 2 is a cross-sectional representation of a semiconductor structure 200 in accordance with some embodiments. The structure and materials of semiconductor structure 200 and the method used to form semiconductor structure 200 are similar to those of semiconductor structure 100 except a contact modulation structure 126' is not in direct contact with gate structure 104.

Similar to semiconductor structure 100, semiconductor structure 200 includes gate structure 104 formed over substrate 102, and seal layer 110 and spacers 112 are formed over the sidewalls of gate structure 104 in accordance with some embodiments. In addition, source and drain regions 114 are formed adjacent to gate structure 104 in substrate 102. First inter-layer dielectric layer 118 is formed over substrate 102 and surrounds gate structure 104.

In addition, a third inter-layer dielectric layer 146 is formed over gate structure 104 and first inter-layer dielectric layer 146 before contact modulation structure 126' is formed. In some embodiments, third inter-layer dielectric layer 146 is made of silicon oxide, silicon nitride, silicon oxynitride, or other applicable dielectric materials that are similar to, or the same as, second inter-layer dielectric layer 128. Third inter-layer dielectric layer 146 may be formed by chemical vapor deposition (CVD), physical vapor deposition, (PVD), atomic layer deposition (ALD), spin-on coating, or other applicable processes.

After third inter-layer dielectric layer 146 is formed, contact modulation structure 126' is formed on third inter-layer dielectric layer 146 over gate structure 104, as shown in FIG. 2 in accordance with some embodiments. The materials and processes of forming contact modulation structure 126' may be similar to, or the same as, those of forming contact modulation structure 126, and therefore the details are not repeated herein.

After contact modulation structure 126' is formed, second inter-layer dielectric layer 128 is formed over contact modulation structure 126' and third inter-layer dielectric layer 146 over substrate 102. Afterwards, first contact 142 is formed through second inter-layer dielectric layer 128, third inter-layer dielectric layer 146, and first inter-layer dielectric layer 118 over source and drain regions 114. Second contact 144 is formed through second inter-layer dielectric layer 128, contact modulation structure 126', and third inter-layer dielectric layer 146 over gate structure 104.

As shown in FIG. 2, although contact modulation structure 126' is not in direct contact with gate structure but is positioned between second inter-layer dielectric layer 128 and third inter-layer dielectric layer 146, contact modulation structure 126' can still prevent the formation of by-products over gate structure 104 since contact modulation structure 126' still has a relatively slow etching rate compared to the etching rate of first inter-layer dielectric layer 118. In addition, since contact modulation structure 126' is formed over third inter-layer dielectric layer 146 instead of being directly formed on gate structure 104, the applications of contact modulation structure 126' will not be limited by the materials or types of gate structures. Therefore, contact modulation structure 126' may be easily applied to various types of gate structures.

As shown in FIGS. 1A to 1G and FIG. 2, a contact modulation structure, such as contact modulation structures 126 and 126', is formed over gate structure 104 but not over source and drain regions 114. In addition, the contact modulation structure has a relatively low etching rate, compared to the etching rate of first inter-layer dielectric layer 118. Therefore, when first contact trench 138 and second contact trench 140 are formed by etching process 136, the amount of time used for forming first contact trench 138 is substantially equal to the amount of time used for forming second contact trench 140. Therefore, the over-etching of gate structure 104 during etching process 136 can be prevented, and the formation of by-products over gate structure 104 can also be prevented. Accordingly, the contact resistance of second contact 144 can be reduced.

Furthermore, since the formation of the contact modulation structure can prevent the formation of by-products, first contact 142 and second contact 144 can be formed by the same process. Moreover, the formation of the contact modulation structure can be easily applied to the original semiconductor formation process. For example, the mask used to pattern gate structure 104 may also be used to pattern the contact modulation structure. In addition, the position of the contact modulation structure does not have to be precisely aligned with gate structure, as long as the contact modulation structure is formed at the portion where second contact trench 140 is formed but not at the portion where first contact trench 138 is formed. Therefore, no complicated processes are required.

Embodiments for forming a semiconductor structure are provided. The semiconductor structure includes a gate structure and source and drain regions formed adjacent to the gate structure. A first contact is formed over the source and drain regions and a second contact is formed over the gate structure. In addition, a contact modulation structure is formed over the gate structure, such that the second contact is formed through the contact modulation structure, while the first contact is not in direct contact with the contact modulation structure. The formation of the contact modulation structure can prevent the formation of by-products formed over the gate structure during an etching process, and therefore the contact resistance of the second contact can be reduced.

In some embodiments, a method for forming a semiconductor structure is provided. The method for forming a semiconductor structure includes forming a gate structure over a substrate and forming source and drain regions adjacent to the gate structure in the substrate. The method for forming a semiconductor structure further includes forming a first inter-layer dielectric layer surrounding the gate structure over the source and drain regions over the substrate and forming a contact modulation structure over the gate structure. The method for forming a semiconductor structure further includes etching the first inter-layer dielectric layer to form a first contact trench over the source and drain regions and etching the contact modulation structure to form a second contact trench over the gate structure by an etching process. The method for forming a semiconductor structure further includes forming a first contact in the first contact trench and a second contact in the second contact trench. In addition, the first inter-layer dielectric layer has a first etching rate and the contact modulation structure has a second etching rate that is less than the first etching rate.

In some embodiments, a method for forming a semiconductor structure is provided. The method for forming a semiconductor structure includes forming a gate structure over a substrate and forming source and drain regions adjacent to the gate structure in the substrate. The method for forming a semiconductor structure further includes forming a first inter-layer dielectric layer surrounding the gate structure over the source and drain regions over the substrate and forming a contact modulation structure over the gate structure. The method for forming a semiconductor structure further includes forming a second inter-layer dielectric layer over the contact modulation structure and the first inter-layer dielectric layer and forming a first contact trench over the source and drain regions and a second contact trench over the gate structure by an etching process. The method for forming a semiconductor structure further includes forming a first contact in the first contact trench over the source and drain regions and a second contact in the second contact trench over the gate structure. In addition, the amount of time needed for etching through the first inter-layer dielectric layer is substantially equal to the amount of time needed for etching through the contact modulation structure.

In some embodiments, a semiconductor structure is provided. The semiconductor structure includes a gate structure formed over a substrate and source and drain regions formed in the substrate adjacent to the gate structure. The semiconductor structure further includes a first inter-layer dielectric layer surrounding the gate structure and a contact modulation structure formed over the gate structure. The semiconductor structure further includes a first contact formed through the first inter-layer dielectric layer and in contact with the source and drain regions and a second contact formed through the contact modulation structure and in contact with the gate structure. In addition, the first contact is not in direct contact with the contact modulation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
    forming a gate structure over a substrate;
    forming source and drain regions adjacent to the gate structure in the substrate;

forming a first inter-layer dielectric layer surrounding the gate structure over the source and drain regions over the substrate;

forming a second inter-layer dielectric layer over the gate structure and the first inter-layer dielectric layer;

forming a contact modulation structure over a portion of the second inter-layer dielectric layer over the gate structure;

forming a first contact trench through the second inter-layer dielectric layer and the first inter-layer dielectric layer over the source and drain regions and forming a second contact trench through the second inter-layer dielectric layer and the contact modulation structure over the gate structure by performing a same etching process using a same etchant;

forming a first contact in the first contact trench and a second contact in the second contact trench, wherein the first inter-layer dielectric layer has a first etching rate and the contact modulation structure has a second etching rate that is less than the first etching rate during the same etching process.

2. The method for forming a semiconductor structure as claimed in claim 1, wherein a ratio of the first etching rate to the second etching rate is in a range from about 2.5:1 to about 100:1.

3. The method for forming a semiconductor structure as claimed in claim 1, wherein an amount of time used for etching through the first inter-layer dielectric layer is substantially equal to an amount of time used for etching through the contact modulation structure.

4. The method for forming a semiconductor structure as claimed in claim 1, wherein the second contact is in direct contact with the contact modulation structure, while the first contact is not in direct contact with the contact modulation structure.

5. The method for forming a semiconductor structure as claimed in claim 1, wherein the etching process comprises using an etching gas, and the etching gas comprises helium (He), argon (Ar), hydrogen bromide (HBr), nitrogen ($N_2$), methane ($CH_4$), tetrafluoromethane ($CF_4$), monofluoromethane ($CH_3F$), difluoromethane ($CH_2F_2$), trifluoromethane ($CHF_3$), oxygen ($O_2$), or a combination thereof.

6. The method for forming a semiconductor structure as claimed in claim 1, wherein the step of forming a contact modulation structure over the gate structure further comprises:

depositing a contact modulation layer over the gate structure and the first inter-layer dielectric layer; and removing a portion of the contact modulation layer over the source and drain regions to form the contact modulation structure over the gate structure, wherein the contact modulation structure and the first inter-layer dielectric layer are made of different materials.

7. The method for forming a semiconductor structure as claimed in claim 1, further comprising:

forming a third inter-layer dielectric layer over the contact modulation structure and the second inter-layer dielectric layer before forming the first contact and the second contact.

8. The method for forming a semiconductor structure as claimed in claim 1, further comprising:

forming a third inter-layer dielectric layer over the contact modulation structure and the second inter-layer dielectric layer after forming the contact modulation structure.

9. The method for forming a semiconductor structure as claimed in claim 1, wherein the step of etching the first inter-layer dielectric layer to form a first contact trench over the source and drain regions and the step of etching the contact modulation structure are performed simultaneously by performing the same etching process.

10. The method for forming a semiconductor structure as claimed in claim 1, wherein the first inter-layer dielectric layer and the contact modulation structure are made of different materials.

11. A method for forming a semiconductor structure, comprising:

forming a gate structure over a substrate;

forming source and drain regions adjacent to the gate structure in the substrate;

forming a first inter-layer dielectric layer surrounding the gate structure over the source and drain regions over the substrate;

forming a third inter-layer dielectric layer over the gate structure and the first inter-layer dielectric layer;

forming a contact modulation structure over the gate structure;

forming a second inter-layer dielectric layer over the contact modulation structure and the second inter-layer dielectric layer;

forming a first contact trench over the source and drain regions and a second contact trench over the gate structure by performing a same etching process using a same etchant;

forming a first contact in the first contact trench over the source and drain regions and a second contact in the second contact trench over the gate structure, wherein an amount of time used for etching through the first inter-layer dielectric layer is substantially equal to an amount of time used for etching through the contact modulation structure.

12. The method for forming a semiconductor structure as claimed in claim 11, wherein the first inter-layer dielectric layer has a first etching rate and the contact modulation structure has a second etching rate that is less than the first etching rate during the same etching process.

13. The method for forming a semiconductor structure as claimed in claim 12, wherein a ratio of the first etching rate to the second etching rate is in a range from about 2.5:1 to about 100:1.

14. The method for forming a semiconductor structure as claimed in claim 11, wherein the step of forming a contact modulation structure over the gate structure further comprises:

depositing a contact modulation layer over the gate structure and the first inter-layer dielectric layer; and removing a portion of the contact modulation layer over the source and drain regions to form the contact modulation structure over the gate structure, wherein the contact modulation structure and the first inter-layer dielectric layer are made of different materials.

15. The method for forming a semiconductor structure as claimed in claim 11, wherein the step of forming the first contact trench over the source and drain regions and the step of forming the second contact trench over the gate structure are performed simultaneously by performing the same etching process.

16. A semiconductor structure, comprising:

a gate structure formed over a substrate;

source and drain regions formed in the substrate adjacent to the gate structure;

a first inter-layer dielectric layer surrounding the gate structure;

a contact modulation structure formed over the gate structure;

a first contact formed through the first inter-layer dielectric layer and in contact with the source and drain regions;

a second contact formed through the contact modulation structure and in contact with the gate structure;

a second inter-layer dielectric layer formed over the contact modulation structure and the first inter-layer dielectric layer; and a third inter-layer dielectric layer formed between the gate structure and the contact modulation structure, wherein the first contact is not in direct contact with the contact modulation structure.

17. The semiconductor structure as claimed in claim 16, wherein the first inter-layer dielectric layer has a first thickness and the contact modulation structure has a second thickness that is less than the first thickness.

18. The semiconductor structure as claimed in claim 17, wherein a ratio of the first thickness to the second thickness is in a range from about 100:1 to about 2.5:1.

19. The semiconductor structure as claimed in claim 16, wherein the first inter-layer dielectric layer and the contact modulation structure are made of different materials.

20. The semiconductor structure as claimed in claim 16, wherein the contact modulation structure overlaps with the gate structure but does not overlap with the source and drain regions.

* * * * *